USO11289258B2

(12) United States Patent
Ochiai et al.

(10) Patent No.: US 11,289,258 B2
(45) Date of Patent: Mar. 29, 2022

(54) INDUCTANCE ELEMENT, HIGH-FREQUENCY TRANSFORMER ELEMENT, IMPEDANCE CONVERSION ELEMENT, AND ANTENNA DEVICE

(71) Applicant: Murata Manufacturing Co., Ltd., Nagaokakyo (JP)

(72) Inventors: Akira Ochiai, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1206 days.

(21) Appl. No.: 15/681,483

(22) Filed: Aug. 21, 2017

(65) Prior Publication Data

US 2017/0345539 A1 Nov. 30, 2017

Related U.S. Application Data

(63) Continuation of application No. PCT/JP2016/054644, filed on Feb. 18, 2016.

(30) Foreign Application Priority Data

Feb. 23, 2015 (JP) .............................. JP2015-032521

(51) Int. Cl.
*H01F 19/04* (2006.01)
*H01F 17/00* (2006.01)
(Continued)

(52) U.S. Cl.
CPC .............. *H01F 17/00* (2013.01); *H01F 5/04* (2013.01); *H01F 19/04* (2013.01);
(Continued)

(58) Field of Classification Search
CPC ...... H01F 17/00; H01F 27/36; H01F 27/2804; H01F 5/04; H01F 19/04; H01F 2027/2809; H01F 2005/046; H03H 7/383; H01Q 1/50
See application file for complete search history.

(56) References Cited

U.S. PATENT DOCUMENTS 5,990,776 A * 11/1999 Jitaru .................. H01F 27/2804
  336/200
6,977,573 B1 12/2005 Maeda et al.
(Continued)

FOREIGN PATENT DOCUMENTS

JP    63-116410 A    5/1988
JP    2006-032424 A    2/2006
(Continued)

OTHER PUBLICATIONS

Official Communication issued in International Patent Application No. PCT/JP2016/054644, dated Apr. 26, 2016.

*Primary Examiner* — Mang Tin Bik Lian
(74) *Attorney, Agent, or Firm* — Keating & Bennett, LLP

(57) ABSTRACT

In a high-frequency transformer element includes a primary coil including first coil conductors and a secondary coil including second coil conductors are disposed in a multilayer body that includes a plurality of insulating layers. A magnetic-field cancellation conductor pattern is disposed in the multilayer body, is adjacent to some conductors of the first coil conductors in a lamination direction of the insulating layers, is arranged along a surface of the insulating layers, and allows a high-frequency current to flow in a direction opposite a high-frequency current flowing in the first coil conductors.

12 Claims, 9 Drawing Sheets

(51) Int. Cl.
  *H03H 7/38* (2006.01)
  *H01F 27/28* (2006.01)
  *H01F 27/36* (2006.01)
  *H01Q 1/50* (2006.01)
  *H01F 5/04* (2006.01)

(52) U.S. Cl.
  CPC ......... *H01F 27/2804* (2013.01); *H01F 27/36* (2013.01); *H01Q 1/50* (2013.01); *H03H 7/383* (2013.01); *H01F 2005/046* (2013.01); *H01F 2027/2809* (2013.01)

(56) References Cited

U.S. PATENT DOCUMENTS

| | | | |
|---|---|---|---|
| 7,656,262 B2* | 2/2010 | Muto | H03H 7/42 336/200 |
| 2006/0006971 A1 | 1/2006 | Maeda et al. | |
| 2009/0121806 A1* | 5/2009 | Sasaki | H03H 7/1758 333/174 |
| 2011/0309994 A1* | 12/2011 | Kato | H01Q 1/50 343/860 |
| 2012/0032758 A1* | 2/2012 | Mori | H01P 1/20345 333/185 |
| 2012/0139814 A1* | 6/2012 | Ishizuka | H01Q 1/243 343/860 |
| 2012/0249105 A1* | 10/2012 | Nussbaum | H01F 27/2804 323/283 |
| 2015/0178434 A1 | 6/2015 | Ishizuka et al. | |
| 2015/0180440 A1 | 6/2015 | Ishizuka | |
| 2016/0351327 A1* | 12/2016 | Shigematsu | H01F 17/00 |

FOREIGN PATENT DOCUMENTS

| | | |
|---|---|---|
| JP | 4900515 B1 | 3/2012 |
| JP | 2013-191660 A | 9/2013 |
| WO | 2014/050482 A1 | 4/2014 |
| WO | 2014/050552 A1 | 4/2014 |
| WO | 2014/188739 A1 | 11/2014 |

* cited by examiner

FIG. 8A
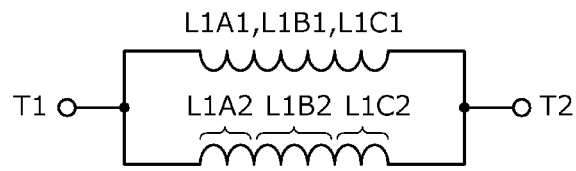
FIG. 8B
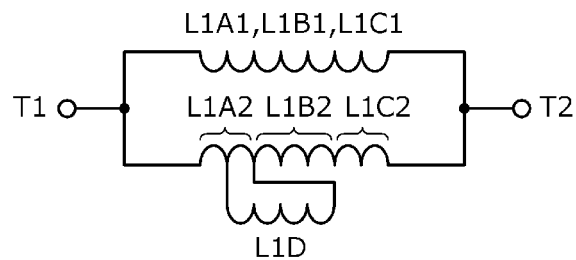
FIG. 8C
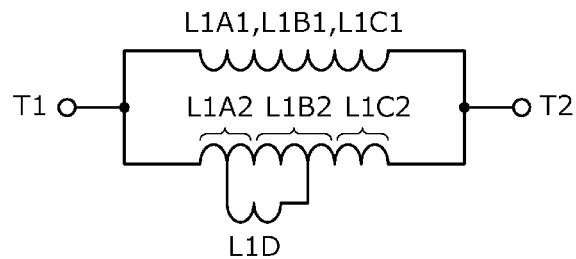
FIG. 9
|     | L1 (nH) | L2 (nH) | ⊿L1 (nH) | ⊿L2 (nH) |
|-----|---------|---------|----------|----------|
| (1) | 1.33    | 3.33    | -        | -        |
| (2) | 0.87    | 2.66    | -0.46    | -0.66    |
| (3) | 1.09    | 2.95    | -0.23    | -0.38    |
| (4) | 0.65    | 2.31    | -0.68    | -1.02    |
| (5) | 0.86    | 2.57    | -0.47    | -0.76    |

INDUCTANCE ELEMENT, HIGH-FREQUENCY TRANSFORMER ELEMENT, IMPEDANCE CONVERSION ELEMENT, AND ANTENNA DEVICE

CROSS REFERENCE TO RELATED APPLICATIONS

This application claims the benefit of priority to Japanese Patent Application No. 2015-032521 filed on Feb. 23, 2015 and is a Continuation Application of PCT Application No. PCT/JP2016/054644 filed on Feb. 18, 2016. The entire contents of each application are hereby incorporated herein by reference.

BACKGROUND OF THE INVENTION

1. Field of the Invention

The present invention relates to an inductance element, a high-frequency transformer element, an impedance conversion element including the high-frequency transformer element, and an antenna device.

2. Description of the Related Art

Input impedance of an antenna used in a cellular phone terminal or other device in recent years is significantly lower than the impedance of a feeder circuit as a consequence of its widened ranges and its miniaturization.

A matching circuit including a transformer, such as the one illustrated in Japanese Patent No. 4900515, is effective to match the circuits having a large impedance ratio over a wide range because frequency characteristics are unlikely to appear in transforming impedance.

Here, one case where a small high-frequency transformer is incorporated in a multilayer body including insulating layers to form a surface mount device is discussed. In this case, when a first input/output terminal and a second input/output terminal are disposed on sides of the multilayer body that are opposed to each other as seen in plan view, in order to form a coil conductor pattern such that it begins at the first input/output terminal and ends at the second input/output terminal, it is necessary to configure the coil conductor pattern such that its number of turns is a multiple of 0.5.

FIG. 13 illustrates a positional relationship between a first input/output terminal Ta and a second input/output terminal Tb and a coil conductor pattern Lh with 0.5 turns disposed between the first input/output terminal Ta and second input/output terminal Tb. Because the minimum unit of the number of turns of the coil conductor pattern is 0.5, the number of turns of the coil conductor pattern that can be designed are multiples of 0.5, for example, 0.5, 1.0, 1.5, 2.0, . . . , which are discrete values. Thus, it is difficult to minutely set the inductance value and the transformer ratio. As such, it is also difficult to obtain high-frequency transformers having various impedance conversion ratios.

SUMMARY OF THE INVENTION

Preferred embodiments of the present invention provide inductance elements including a structure that is effective to obtain a desired inductance even when the positions of input/output terminals are limited, high-frequency transformers including a structure that is effective to obtain a desired transformer ratio, impedance conversion elements including a high-frequency transformer, and antenna devices.

An inductance element according to a preferred embodiment of the present invention includes a coil provided in a multilayer body including a plurality of insulating layers. The coil includes a coil conductor and an interlayer connection conductor electrically connected to the coil conductor. The coil conductor is arranged along a surface of the insulating layers. A magnetic-field cancellation conductor pattern is disposed in the multilayer body. The magnetic-field cancellation conductor pattern is adjacent to a portion of the coil conductor in a lamination direction of the insulating layers, is arranged along a surface of the insulating layers, and allows a high-frequency current to flow in a direction opposite a high-frequency current flowing in the coil conductor.

With the above-described configuration, even when the possible numbers of turns and the possible inductance are discrete because the positions of the input/output terminals are fixed, desired or substantially desired inductance values are able to be obtained.

In an inductance element according to a preferred embodiment of the present invention, the magnetic-field cancellation conductor pattern may preferably have substantially the same or substantially the same shape (outside diameter dimension, inside diameter dimension, winding axis) as a shape of a portion or all of the coil conductor as seen in plan view. With this configuration, the coupling between the magnetic-field cancellation conductor pattern and the coil conductor is improved, and even when the magnetic-field cancellation conductor pattern is relatively short, the inductance is able to be set over a wide range. A reduction in the length of the magnetic-field cancellation conductor pattern prevents a conductor loss increase caused by the magnetic-field cancellation conductor pattern.

In an inductance element according to a preferred embodiment of the present invention, an amount of adjustment in the inductance of the coil conductor provided by the magnetic-field cancellation conductor pattern may preferably be defined by a length of a portion adjacent to the coil conductor of the magnetic-field cancellation conductor pattern or by a distance from the magnetic-field cancellation conductor pattern to the coil conductor in the lamination direction of the insulating layers. With this configuration, the inductance of the coil conductor is able to be easily set by changing the magnetic-field cancellation conductor pattern or by changing the thickness of the insulating layers.

A high-frequency transformer element according to a preferred embodiment of the present invention includes a primary coil and a secondary coil. The primary coil is disposed in a multilayer body including a plurality of insulating layers and includes a first coil conductor arranged along a surface of the insulating layers and an interlayer connection conductor electrically connected to the first coil conductor. The secondary coil is disposed in the multilayer body and includes a second coil conductor arranged along a surface of the insulating layers and an interlayer connection conductor electrically connected to the second coil conductor. A magnetic-field cancellation conductor pattern is disposed in the multilayer body, and the magnetic-field cancellation conductor pattern is adjacent to a portion of the first coil conductor in a lamination direction of the insulating layers, is arranged along a surface of the insulating layers, and allows a high-frequency current to flow in a direction opposite a high-frequency current flowing in the first coil conductor.

With the above-described configuration, even when the possible numbers of turns and the possible inductance are discrete because the positions of the input/output terminals are fixed, a desired or substantially desired inductance is able be obtained. Thus, the transformer ratio of the transformer including the first coil and the second coil is able to be set at desired values that are not discrete.

In a high-frequency transformer element according to a preferred embodiment of the present invention, the magnetic-field cancellation conductor pattern may preferably have the same or substantially the same shape (outside diameter dimension, inside diameter dimension, winding axis) as a shape of a portion or all of the first coil conductor and the second coil conductor as seen in plan view. With this configuration, the coupling between the magnetic-field cancellation conductor pattern and the coil conductor is improved, and even when the magnetic-field cancellation conductor pattern is relatively short, the inductance is able be set over a wide range. The reduction in the length of the magnetic-field cancellation conductor pattern prevents a conductor loss increase caused by the magnetic-field cancellation conductor pattern.

In a high-frequency transformer element according to a preferred embodiment of the present invention, the magnetic-field cancellation conductor pattern may preferably be arranged on a layer nearer to the first coil conductor than to the second coil conductor. With this configuration, the influence of the coupling of the magnetic-field cancellation conductor pattern to the second coil is reduced or prevented.

In a high-frequency transformer element according to a preferred embodiment of the present invention, an amount of adjustment in the inductance of the first coil conductor provided by the magnetic-field cancellation conductor pattern may preferably be defined by a length of a portion adjacent to the first coil conductor of the magnetic-field cancellation conductor pattern or by a distance from the magnetic-field cancellation conductor pattern to the first coil conductor in the lamination direction of the insulating layers. With this configuration, the inductance of the coil conductor is able to be easily set by changing the magnetic-field cancellation conductor pattern or by changing the thickness of the insulating layers.

An impedance conversion element according to a preferred embodiment of the present invention includes the high-frequency transformer element according to a preferred embodiment of the present invention. A first end of the primary coil is connected to a feeding port, a second end of the primary coil is connected to an antenna port, a first end of the secondary coil is connected to the antenna port, and a second end of the secondary coil is connected to a ground. The impedance conversion element converts impedance between the feeding port and the antenna port.

With the above-described configuration, a feeder circuit and an antenna are able to be matched with desired impedance conversion ratios that are not discrete.

In an impedance conversion element according to a preferred embodiment of the present invention, the multilayer body may preferably have a rectangular or substantially rectangular parallelepiped shape, the impedance conversion element may preferably further include input/output terminals on a first side (side surface) and a second side (side surface) of the multilayer body, respectively, the first side and the second side may preferably be opposed to each other as seen in plan view, the impedance conversion element may preferably further include a ground terminal on a third side (side surface) or a fourth side (side surface) of the multilayer body, and the third side and the fourth side may preferably be opposed to each other as seen in plan view. With this configuration, the impedance conversion element is able to be easily arranged in a transmission path between the feeder circuit and the antenna.

An antenna device according to a preferred embodiment of the present invention includes the impedance conversion element according to a preferred embodiment of the present invention and an antenna element connected to the antenna port.

With the above-described configuration, an antenna device that easily matches the feeder circuit is obtained.

According to various preferred embodiments of the present invention, even under conditions in which the number of turns is small and the planar size and the positions of the input/output terminals are fixed, desired or substantially desired inductances are able to be provided. High-frequency transformers having a substantially desired transformer ratio are obtained. Impedance conversion elements having a desired or substantially desired impedance conversion ratio are obtained. Furthermore, antenna devices that easily match a feeder circuit are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 8A-8C are circuit diagrams of primary coils in high-frequency transformers including the conductor patterns illustrated in FIGS. 7A-7C, respectively.

FIG. 9 illustrates changes in the inductance of a primary coil L1 and a secondary coil L2 for different numbers of turns of a magnetic-field cancellation conductor pattern L1D and for different layer-to-layer distances between the magnetic-field cancellation conductor pattern L1D and a first coil conductor L1A2.

DETAILED DESCRIPTION OF THE PREFERRED EMBODIMENTS

Figure 1:
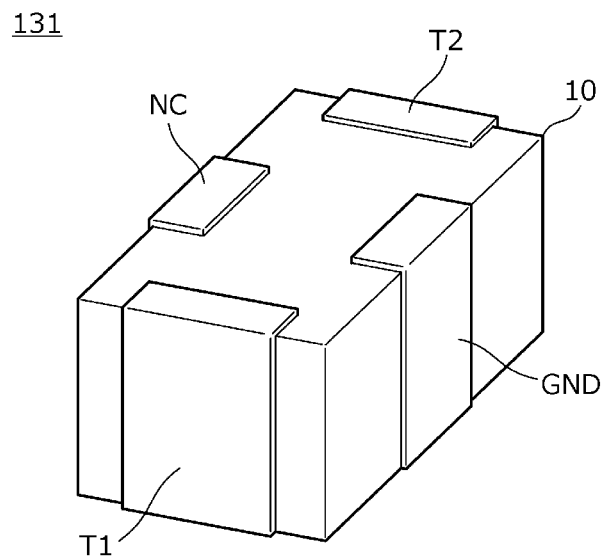
FIG. 1 is a perspective view of an impedance conversion element 131 according to a first preferred embodiment of the present invention.

Preferred embodiments of the present invention are described below with reference to the drawings. The same portions are designated by the same numerals in the drawings. In second and subsequent preferred embodiments, the elements and aspects in common with a first preferred embodiment are not described, and the different elements and aspects are described. In particular, similar operational effects based on similar configurations are not described in detail for each preferred embodiment.

First Preferred Embodiment

In a first preferred embodiment of the present invention, examples of a high-frequency transformer element, an impedance conversion element, and an antenna device are illustrated. In the present preferred embodiment, a high-frequency transformer is an impedance conversion element and this impedance conversion element is preferably used as an impedance matching circuit for a feeder circuit and an antenna element, and the impedance conversion element and the antenna element define the antenna device.

FIG. 1 is a perspective view of an impedance conversion element 131 according to the first preferred embodiment. The impedance conversion element 131 includes a multilayer body 10 including a plurality of insulating layers. In the multilayer body 10, a high-frequency transformer including a primary coil and a secondary coil and an impedance conversion circuit including the high-frequency transformer are disposed. A feeding terminal T1, an antenna terminal T2, a ground terminal GND, and an unused terminal NC are disposed on the outer surface of the multilayer body 10.

Figure 2:
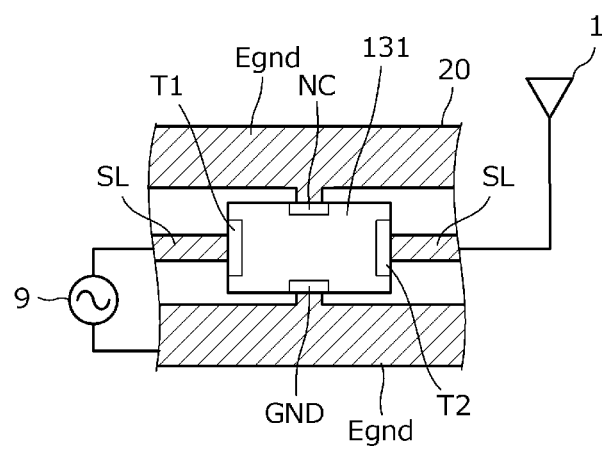
FIG. 2 is a plan view that illustrates a structure in which the impedance conversion element 131 is mounted on a substrate 20.

FIG. 2 is a plan view that illustrates a structure in which the impedance conversion element 131 is mounted on a substrate 20. The substrate 20 is provided with a ground conductor Egnd and a signal line SL defining a transmission line having a coplanar line structure. This transmission line is connected to an antenna element 1 and a feeder circuit 9. The impedance conversion element 131 is mounted on the substrate 20 such that its terminals T1 and T2 are connected in series in the transmission line (in the signal line SL) and the ground terminal GND and the unused terminal NC are connected to the ground conductor Egnd. The impedance conversion element 131 and the antenna element 1 define an antenna device 201.

As illustrated, the multilayer body in the impedance conversion element 131 preferably has a rectangular or substantially rectangular parallelepiped shape, the input/output terminals T1 and T2 are disposed on a first side (side surface) and a second side (side surface) of the multilayer body, respectively, that are opposed to each other as seen in plan view, and the ground terminal GND is disposed on a third side (side surface) or a fourth side (side surface) of the multilayer body, the third and fourth sides being opposed to each other as seen in plan view. Therefore, the impedance conversion element 131 is able to be easily arranged in the transmission path between the feeder circuit and the antenna.

Figure 3:
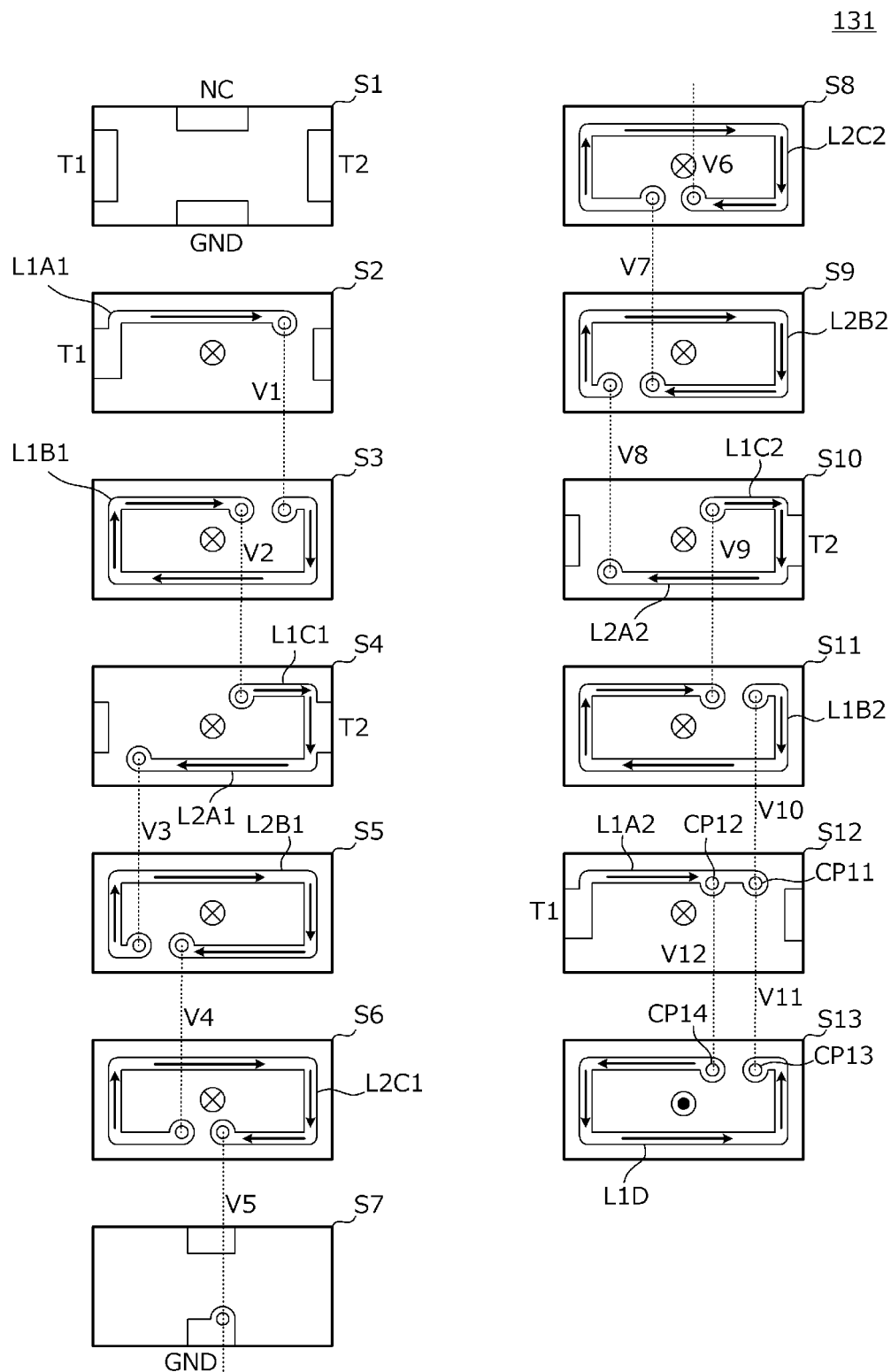
FIG. 3 is an exploded plan view of the impedance conversion element 131.
Figure 4:
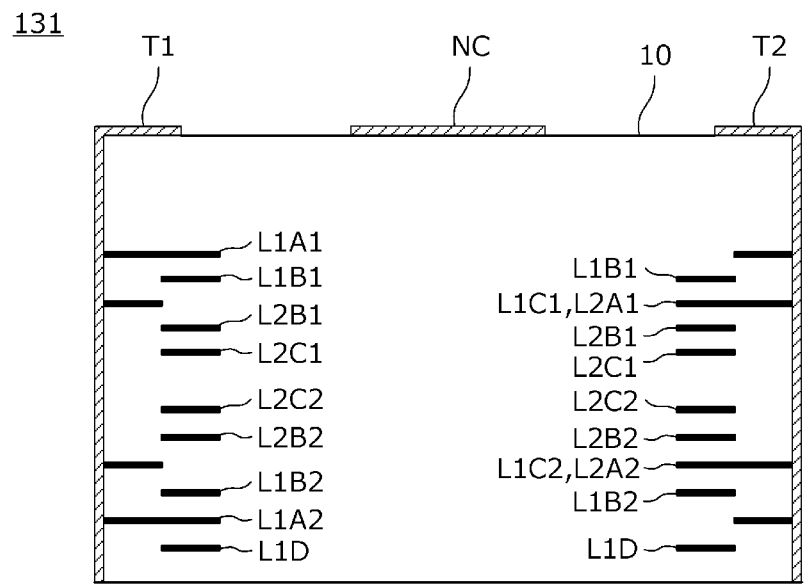
FIG. 4 is a cross-sectional view of the impedance conversion element 131.

FIG. 3 is an exploded plan view of the impedance conversion element 131. FIG. 4 is a cross-sectional view of the impedance conversion element 131. In FIG. 4, the hatching for the multilayer body 10 is omitted for the sake of clarity of illustration. The impedance conversion element 131 includes a plurality of layers S1 to S13 having insulation properties. Various conductor patterns are disposed on the layers S1 to S13. The "various conductor patterns" preferably include not only conductor patterns on the surfaces of the layers but also a plurality of interlayer connection conductors. The interlayer connection conductors preferably include not only via conductors but also end-face electrodes on end surfaces of the multilayer body 10 (see FIG. 1). As described below, the interlayer connection conductors are electrically connected to predetermined coil conductors.

When the impedance conversion element 131 is a ceramic component, the layers are preferably nonmagnetic ceramic layers, and the conductor patterns are preferably printed patterns made of a conductive material, such as copper paste, for example. When the impedance conversion element 131 is a resin multilayer component, the layers are preferably sheets made of a resin material, and the conductor patterns are preferably patterns made of metal foil, such as aluminum foil or copper foil, for example.

The upper surface of the layer S1 corresponds to the mounting surface (lower surface) of the multilayer body 10. The terminals T1, T2, GND, and NC are disposed on the layer S1.

First coil conductors L1A1, L1B1, and L1C1 are disposed on the layers S2, S3, and S4, respectively. Second coil conductors L2A1, L2B1, and L2C1 are disposed on the layers S4, S5, and S6, respectively. Second coil conductors L2C2, L2B2, and L2A2 are disposed on the layers S8, S9, and S10, respectively. First coil conductors L1C2, L1B2, and L1A2 are disposed on the layers S10, S11, and S12, respectively. Each of the coil conductors is preferably a loop conductor pattern of one or less turn. A magnetic-field cancellation conductor pattern L1D is disposed on the layer S13. The magnetic-field cancellation conductor pattern L1D has the same or substantially the same shape (outside diameter dimension, inside diameter dimension, winding axis) as that of a portion or all of the first coil conductors L1C2, L1B2, and L1A2 as seen in plan view. The magnetic-field cancellation conductor pattern L1D is also preferably a loop conductor pattern of one or less turn.

In FIG. 3, the directions of currents flowing in the conductor patterns at a timing (phase) are indicated by arrows. The directions of magnetic flux produced by the currents are indicated by cross marks and dot marks.

A first end of the first coil conductor L1A1 is connected to the feeding terminal T1. A second end of the first coil conductor L1A1 and a first end of the first coil conductor L1B1 are connected to each other by a via conductor V1. A second end of the first coil conductor L1B1 and a first end of the first coil conductor L1C1 are connected to each other by a via conductor V2. A second end of the first coil conductor L1C1 is connected to the antenna terminal T2.

A first end of the second coil conductor L2A1 is connected to the antenna terminal T2. A second end of the second coil conductor L2A1 and a first end of the second coil conductor L2B1 are connected to each other by a via conductor V3. A second end of the second coil conductor L2B1 and a first end of the second coil conductor L2C1 are connected to each other by a via conductor V4. A second end of the second coil conductor L2C1 and the ground terminal GND are connected to each other by a via conductor V5.

A first end of the second coil conductor L2C2 and the ground terminal GND are connected to each other by a via conductor V6. A second end of the second coil conductor L2C2 and a first end of the second coil conductor L2B2 are connected to each other by a via conductor V7. A second end of the second coil conductor L2B2 and a first end of the second coil conductor L2A2 are connected to each other by a via conductor V8. A second end of the second coil conductor L2A2 is connected to the antenna terminal T2.

A first end of the first coil conductor L1C2 is connected to the antenna terminal T2. A second end of the first coil conductor L1C2 and a first end of the first coil conductor L1B2 are connected to each other by a via conductor V9. A second end of the first coil conductor L1B2 and a first end (first connection point CP11) of the first coil conductor L1A2 are connected to each other by a via conductor V10. A second end of the first coil conductor L1A2 is connected to the feeding terminal T1.

The first connection point CP11 of the first coil conductor L1A2 and a first end (first connection point CP13) of the magnetic-field cancellation conductor pattern L1D are connected to each other by a via conductor V11. A second connection point CP12 of the first coil conductor L1A2 and a second end (second connection point CP14) of the magnetic-field cancellation conductor pattern L1D are connected to each other by a via conductor V12.

The inductance of the magnetic-field cancellation conductor pattern L1D is defined primarily by the length of the magnetic-field cancellation conductor pattern L1D.

The magnetic-field cancellation conductor pattern L1D and the first coil conductor L1A2 are adjacent to each other with the layer S12 disposed therebetween such that they are partially parallel. The magnetic-field cancellation conductor pattern L1D and the first coil conductor L1B2 are adjacent to each other with the layers S11 and S12 disposed therebetween such that they are partially parallel. With this structure, mutual induction occurs in the magnetic-field cancellation conductor pattern L1D and the first coil conductors L1A2 and L1B2.

Thus, the mutual inductance of the magnetic-field cancellation conductor pattern L1D and the first coil conductors L1A2 and L1B2 is defined by the length of the portion adjacent to the first coil conductor L1A2 of the magnetic-field cancellation conductor pattern L1D, the distance (distance in the lamination direction of the insulating layers) between the first coil conductor L1A2 and the magnetic-field cancellation conductor pattern L1D, the length of the portion adjacent to the first coil conductor L1B2 of the magnetic-field cancellation conductor pattern L1D, and the distance (distance in the lamination direction of the insulating layers) between the first coil conductor L1B2 and the magnetic-field cancellation conductor pattern L1D. Accordingly, even when the magnetic-field cancellation conductor pattern L1D is constant, the inductance of the coil conductor linked to this magnetic-field cancellation conductor pattern L1D is able to be defined by the thickness dimensions of the layers S11 and S12.

Figure 5:
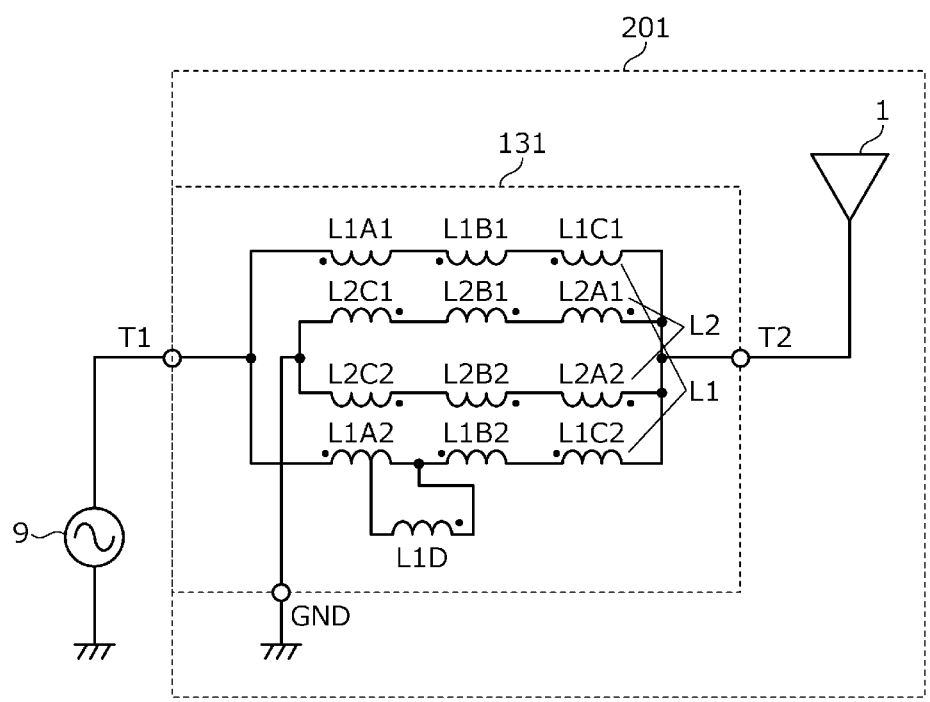
FIG. 5 is a circuit diagram of the impedance conversion element 131 and an antenna device 201 according to a preferred embodiment of the present invention.

FIG. 5 is a circuit diagram of the impedance conversion element 131 and the antenna device 201. The circuit diagram in FIG. 5 is illustrated in consideration of the positional relationship between the coil conductors illustrated in FIGS. 3 and 4.

A first end of a primary coil L1, a second end of the primary coil L1, a first end of a secondary coil L2, and a second end of the secondary coil L2 are connected to the feeding terminal T1, the antenna terminal T2, the antenna terminal T2, and the ground terminal GND, respectively. The feeding terminal T1 is an example of a "feeding port". The antenna terminal T2 is an example of "antenna port".

As illustrated in FIG. 3, the first coil conductors L1A1, L1B1, and L1C1 and the via conductors V1 and V2 define a coil of approximately 1.5 turns. Similarly, the first coil conductors L1A2, L1B2, and L1C2 and the via conductors V9 and V10 define a coil of approximately 1.5 turns. The first coil conductors L1A1, L1B1, and L1C1 preferably have the same or substantially the same outside diameter dimension, inside diameter dimension, and winding axis as those of the first coil conductors L1A2, L1B2, and L1C2, respectively.

As illustrated in FIG. 3, the second coil conductors L2A1, L2B1, and L2C1 and the via conductors V3 and V4 define a coil of approximately 2.25 turns. Similarly, the second coil conductors L2A2, L2B2, and L2C2 and the via conductors V7 and V8 define a coil of approximately 2.25 turns. The second coil conductors L2A1, L2B1, and L2C1 preferably have the same or substantially the same outside diameter dimension, inside diameter dimension, and winding axis as those of the second coil conductors L2A2, L2B2, and L2C2, respectively.

Moreover, the first coil conductors L1A1, L1B1, and L1C1 preferably have the same or substantially the same outside diameter dimension, inside diameter dimension, and winding axis as those of the second coil conductors L2A1, L2B1, and L2C1, respectively. Similarly, the first coil conductors L1A2, L1B2, and L1C2 preferably have the same or substantially the same outside diameter dimension, inside diameter dimension, and winding axis as those of the second coil conductors L2A2, L2B2, and L2C2, respectively.

As illustrated in FIG. 5, the first coil conductors L1A1, L1B1, and L1C1 and the first coil conductors L1A2, L1B2, and L1C2 are connected in parallel and define the primary coil L1. Similarly, the second coil conductors L2A1, L2B1, and L2C1 and the second coil conductors L2A2, L2B2, and L2C2 are connected in parallel and define the secondary coil L2.

The second coil conductors L2A1, L2B1, and L2C1 and the second coil conductors L2A2, L2B2, and L2C2 are arranged between the first coil conductors L1A1, L1B1, and L1C1 and the first coil conductors L1A2, L1B2, and L1C2 along the lamination direction. With this structure, the above-described primary coil L1 and secondary coil L2 are coupled to each other with an appropriately high coupling coefficient even when each of them has a relatively small winding number (number of turns).

The magnetic-field cancellation conductor pattern L1D on the layer S13 illustrated in FIG. 3 is connected in parallel to a portion of the first coil conductor L1A2. As previously described, mutual induction occurs between the magnetic-field cancellation conductor pattern L1D and the first coil conductors L1A2 and L1B2. The direction of the magnetic flux produced by the first coil conductors L1A2, L1B2, and L1C2 and the direction of the magnetic flux produced by the magnetic-field cancellation conductor pattern L1D are opposite to one another. That is, a high-frequency current flows in the magnetic-field cancellation conductor pattern L1D in a direction opposite to the direction of a high-frequency current flowing in the first coil conductors L1A2, L1B2, and L1C2. Thus, the magnetic-field cancellation conductor pattern L1D acts in a direction in which the magnetic flux produced by the first coil conductors L1A2, L1B2, and L1C2 is reduced and, therefore, decreases the inductance of the first coil conductors L1A2, L1B2, and L1C2. Accordingly, the magnetic-field cancellation conductor pattern L1D decreases the inductance of the primary coil L1.

The magnetic-field cancellation conductor pattern L1D is spaced apart from the second coil conductors L2A1, L2B1, L2C1, L2A2, L2B2, and L2C2 in the lamination direction of the insulating layers. That is, the magnetic-field cancellation conductor pattern L1D is arranged on a layer that is nearer to the first coil conductors L1A2, L1B2, and L1C2 than to the second coil conductors L2A1, L2B1, L2C1, L2A2, L2B2, and L2C2. With this structure, the influence on the inductance of the secondary coil L2 including the second coil conductors L2A1, L2B1, L2C1, L2A2, L2B2, and L2C2 is small.

The magnetic-field cancellation conductor pattern L1D has the same or substantially the same shape (outside diameter dimension, inside diameter dimension, and winding axis) as that of almost all of the first coil conductors L1A2, L1B2, and L1C2 as seen in plan view. With this structure, the coupling between the magnetic-field cancellation conductor pattern L1D and the first coil conductors L1A2, L1B2, and L1C2 is improved, and even when the magnetic-field cancellation conductor pattern L1D is relatively short, the inductance is able to be set over a wide range. A reduction in the length of the magnetic-field cancellation conductor pattern L1D prevents a conductor loss increase caused by the magnetic-field cancellation conductor pattern L1D.

Figure 6A:
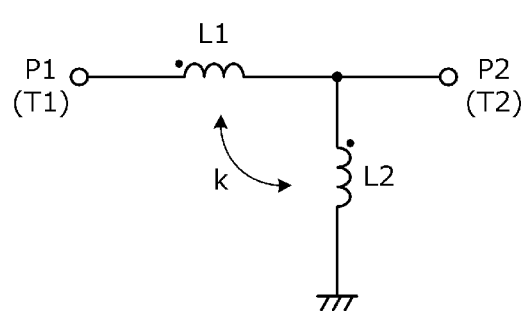
FIGS. 6A and 6B are equivalent circuit diagrams of the impedance conversion element 131.
Figure 6B:
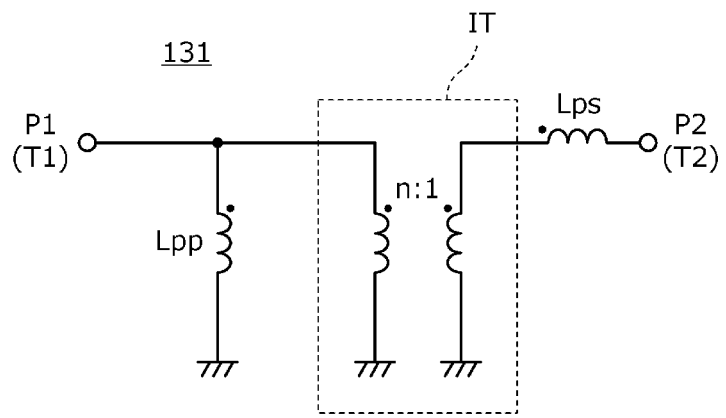

FIGS. 6A and 6B are equivalent circuit diagrams of the impedance conversion element 131. In FIG. 6A, ports P1 and P2 correspond to the above-described terminals T1 and T2. The primary coil L1 and the secondary coil L2 are coupled to each other, and the primary coil L1 and the secondary coil L2 define an autotransformer circuit. FIG. 6B is an equivalent circuit diagram that illustrates an ideal transformer IT and parasitic inductance Lpp and Lps.

Here, when the inductance of the primary coil L1 is represented by L1, the inductance of the secondary coil L2 is represented by L2, the coupling coefficient is represented by k, the transformer ratio is represented by n, and the mutual inductance of the primary coil L1 and secondary coil L2 is represented by M, the following relationship is established.

$$M=k\sqrt{(L1*L2)}$$

$$Lpp=L1+L2+2M$$

$$Lps=\{(1-k^2)*L1*L2\}/(L1+L2+2M)$$

$$n=(L1+L2+2M)/(L2+M)$$

Accordingly, by including the above-described magnetic-field cancellation conductor pattern L1D and adjusting the inductance of the primary coil L1, the transformer ratio n is able to be defined, and the impedance conversion ratio is able to be defined.

In contrast to the example illustrated in FIGS. 3 to 5, the first coil conductors L1A1, L1B1, and L1C1 and the first coil conductors L1A2, L1B2, and L1C2 defining the primary coil L1 may preferably be disposed between the second coil conductors L2A1, L2B1, and L2C1 and the second coil conductors L2A2, L2B2, and L2C2 defining the secondary coil L2 in the lamination direction. Because one end of the secondary coil L2 is connected to the ground, the adjustment of the inductance of the primary coil L1 by the magnetic-field cancellation conductor pattern is more effective at obtaining various transformer ratios. That is, the secondary coil L2 is able to be set by using ¼ turns as a minimum unit and, therefore, the degree of freedom in design is high, whereas the primary coil L1 is able to be set by using ½ turns as a minimum unit and, therefore, the degree of freedom in design is low. Thus, when the magnetic-field cancellation conductor pattern L1D is arranged on the side close to the primary coil L1, the adjustment of the inductance by the magnetic-field cancellation conductor pattern L1D is more effective.

Second Preferred Embodiment

In a second preferred embodiment of the present invention, some examples of the magnetic-field cancellation conductor pattern L1D with different shapes and examples of the inductance obtained thereby are illustrated.

Figure 7A:
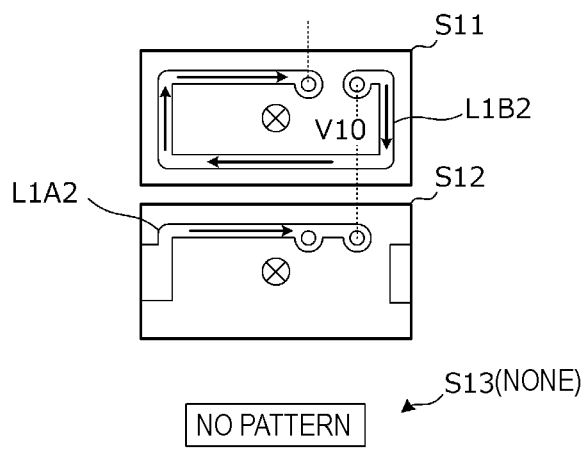
FIGS. 7A-7C illustrate variations of conductor patterns disposed on layers S11, S12, and S13 illustrated in FIG. 3 in the first preferred embodiment of the present invention.
Figure 7B:
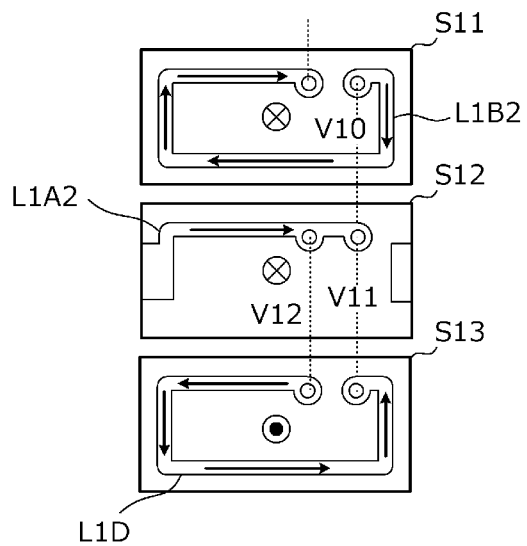
Figure 7C:
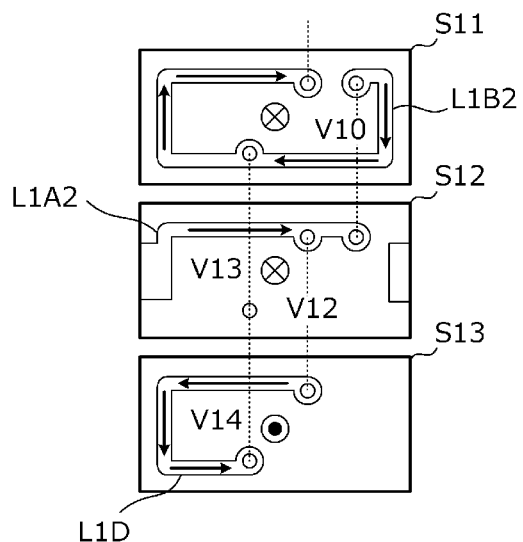

FIG. 7B illustrates the conductor patterns on the layers S11, S12, and S13 illustrated in FIG. 3 in the first preferred embodiment. FIGS. 7A and 7C illustrate variations of the conductor patterns on the layers S11, S12, and S13 illustrated in FIG. 3 in the first preferred embodiment. The conductor patterns on the other layers are preferably the same or substantially the same as those in the first preferred embodiment.

FIGS. 8A-8C are circuit diagrams of primary coils in high-frequency transformers including the conductor patterns illustrated in FIGS. 7A-7C.

In the example illustrated in FIG. 7A, preferably, the layer S13 is not present, or alternatively, the layer S13 is present, but the magnetic-field cancellation conductor pattern L1D is absent therein. Accordingly, the magnetic-field cancellation conductor pattern L1D is not connected to the first coil conductor L1A2, and there is no reduction in the inductance achieved by the magnetic-field cancellation conductor pattern L1D.

In the example illustrated in FIG. 7C, the magnetic-field cancellation conductor pattern L1D on the layer S13 is shorter than that in the example illustrated in FIG. 7B. In the example illustrated in FIG. 7B, the magnetic-field cancellation conductor pattern L1D is connected in parallel to a portion of the first coil conductor L1A2, whereas in the example illustrated in FIG. 7C, the magnetic-field cancellation conductor pattern L1D is connected in parallel to a portion of the first coil conductors L1A2 and L1B2. As illustrated in the example illustrated in FIG. 7C, the magnetic-field cancellation conductor pattern L1D may preferably have the same or substantially the same shape (outside diameter dimension, inside diameter dimension, winding axis) as that of a portion of the first coil conductors L1A2, L1B2, and L1C2 as seen in plan view.

FIG. 9 illustrates changes in the inductance of each of the primary coil L1 and the secondary coil L2 for different numbers of turns of the magnetic-field cancellation conductor pattern L1D and for different layer-to-layer distances between the magnetic-field cancellation conductor pattern L1D and the first coil conductor L1A2. Five conditions in FIG. 9 are described below.

(1) The magnetic-field cancellation conductor pattern L1D is not present.

(2) The number of turns of the magnetic-field cancellation conductor pattern L1D is 1, and the layer-to-layer distance is about 12.5 μm, for example.

(3) The number of turns of the magnetic-field cancellation conductor pattern L1D is 1, and the layer-to-layer distance is about 50 μm, for example.

(4) The number of turns of the magnetic-field cancellation conductor pattern L1D is 0.5, and the layer-to-layer distance is about 12.5 μm, for example.

(5) The number of turns of the magnetic-field cancellation conductor pattern L1D is 0.5, and the layer-to-layer distance is about 50 μm, for example.

In FIG. 9, ΔL1 is the amount of change in the inductance of the primary coil L1 in comparison with the case where the magnetic-field cancellation conductor pattern L1D is not provided, and ΔL2 is the amount of change in the inductance of the secondary coil L2 in comparison with the case where the magnetic-field cancellation conductor pattern L1D is not provided.

In FIG. 9, the difference in ΔL1 between the conditions (2) and (4) or the difference in ΔL1 between the conditions (3) and (5) reveals that for the same layer-to-layer distance, the amount of decrease in the inductance of the primary coil L1 when the number of turns of the magnetic-field cancellation conductor pattern L1D is 0.5 is larger than that when the number of turns of the magnetic-field cancellation conductor pattern L1D is 1. This is because, as the number of turns of the magnetic-field cancellation conductor pattern L1D decreases, the current flowing in the magnetic-field cancellation conductor pattern L1D increases and because the number of turns of the coil conductor connected in parallel to the magnetic-field cancellation conductor pattern L1D increases with a decrease in the number of turns of the magnetic-field cancellation conductor pattern L1D.

The comparison between (ΔL1/L1) and (ΔL2/L2) in FIG. 9 reveals that the influence of the magnetic-field cancellation conductor pattern L1D on the secondary coil L2 is smaller than that on the primary coil L1. This is because the second coil conductors defining the secondary coil L2 are disposed between the first coil conductors defining the primary coil L1 in the lamination direction and the magnetic-field cancellation conductor pattern L1D is arranged on the outermost layer of the multilayer body, as illustrated in FIG. 5. That is, the magnetic-field cancellation conductor pattern L1D is coupled to the first coil conductors more strongly than to the second coil conductors.

In the examples described above, for clarity of the description, the number of turns of the magnetic-field cancellation conductor pattern L1D is set. The amount of adjustment of the inductance by the magnetic-field cancellation conductor pattern may be defined by "the length of the portion adjacent" to the first coil conductors of the magnetic-field cancellation conductor pattern L1D.

As described above, the inductance of the primary coil L1 is able to be set within a predetermined range by appropriately selecting the length of the portion adjacent to the first coil conductors L1A2 of the magnetic-field cancellation conductor pattern L1D. With this structure, the transformer ratio of the high-frequency transformer including the primary coil L1 and the secondary coil L2 illustrated in FIGS. 6A and 6B in the first preferred embodiment is able to be appropriately set. That is, impedance conversion elements with various impedance conversion ratios are able to be obtained.

Third Preferred Embodiment

An example of the high-frequency transformer is illustrated in a third preferred embodiment of the present invention.

Figure 10:
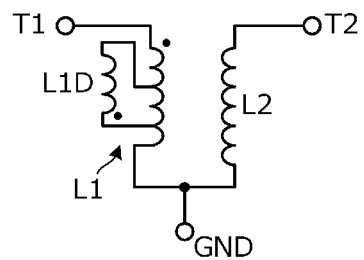
FIG. 10 is a circuit diagram of a high-frequency transformer 121 according to a third preferred embodiment of the present invention.

FIG. 10 is a circuit diagram of a high-frequency transformer 121 according to the third preferred embodiment. The high-frequency transformer 121 includes the primary coil L1 and the secondary coil L2 electromagnetically coupled to each other.

The configuration of the primary coil L1 in the high-frequency transformer 121 illustrated in FIG. 10 is preferably similar to that of the first coil conductors L1A1, L1B1, L1C1, L1A2, L1B2, and L1C2 and the magnetic-field cancellation conductor pattern L1D illustrated in FIGS. 3 and 5 in the first preferred embodiment. The configuration of the secondary coil L2 is preferably similar to the second coil conductors L2A1, L2B1, L2C1, L2A2, L2B2, and L2C2 illustrated in FIGS. 3 and 5.

The function of the magnetic-field cancellation conductor pattern L1D is described in the first and second preferred embodiments. Accordingly, in the configuration illustrated in FIG. 10, the magnetic-field cancellation conductor pattern L1D adjusts the inductance of the primary coil L1 so as to reduce it. With this configuration, the transformer ratio of the high-frequency transformer including the primary coil L1 and the secondary coil L2 is able to be appropriately set.

The relationship between the primary and secondary sides in the high-frequency transformer is reversible. Therefore, the terminals T1 and T2 may also be used as the secondary side and the primary side, respectively.

Fourth Preferred Embodiment

Figure 11:
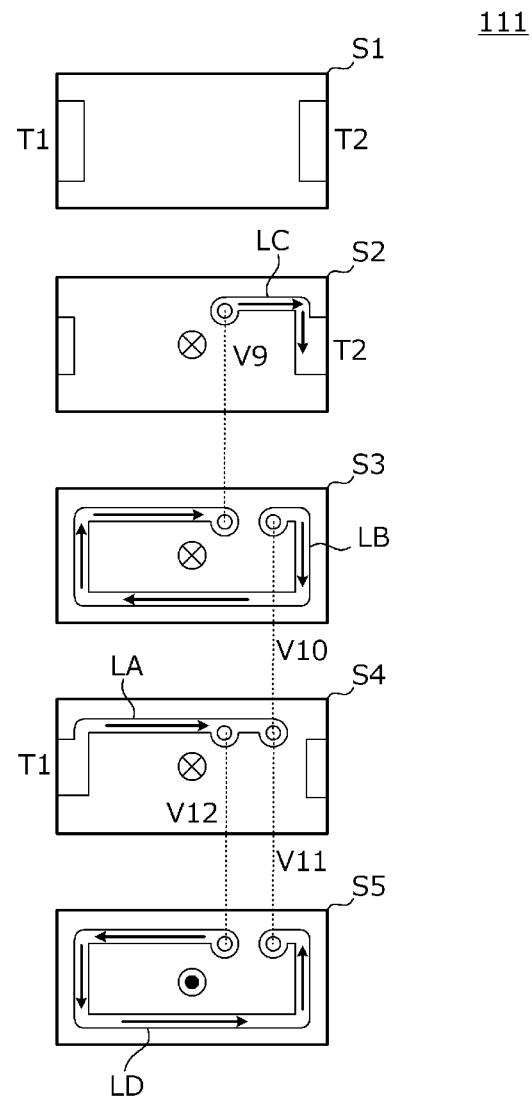
FIG. 11 is an exploded plan view of an inductance element 111 according to a fourth preferred embodiment of the present invention.
Figure 12:
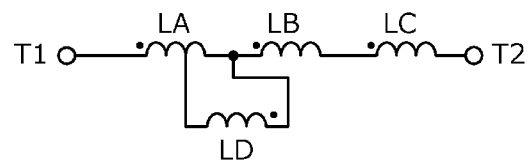
FIG. 12 is a circuit diagram of the inductance element 111 according to the fourth preferred embodiment of the present invention.
Figure 13:
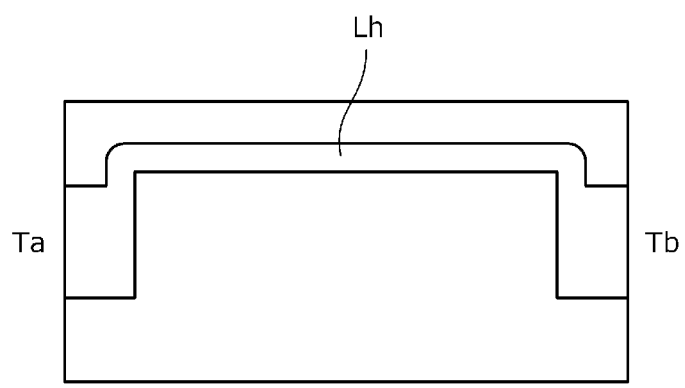
FIG. 13 illustrates a positional relationship between a first input/output terminal Ta and a second input/output terminal Tb and an example of a coil conductor pattern Lh with 0.5 turns disposed between the first input/output terminal Ta and the second input/output terminal Tb.

An example of the inductance element is illustrated in a fourth preferred embodiment of the present invention. FIG. 11 is an exploded plan view of an inductance element 111 according to the fourth preferred embodiment. FIG. 12 is a circuit diagram of the inductance element 111. The inductance element 111 includes the plurality of layers S1 to S5 having insulation properties. Various conductor patterns are disposed on the layers S1 to S5. The "various conductor patterns" preferably include not only conductor patterns on the surfaces of the layers but also interlayer connection conductors. The inductance element 111 is a multilayer body including the layers S1 to S5 with the above-described conductor patterns provided thereon.

The upper surface of the layer S1 corresponds to the mounting surface (lower surface) of the multilayer body. The terminals T1 and T2 are disposed on the layer S1.

Coil conductors LC, LB, and LA are disposed on the layers S2, S3, and S4, respectively. A magnetic-field cancellation conductor pattern LD is disposed on the layer S5. In FIG. 11, the directions of currents flowing in the conductor patterns at a timing (phase) are indicated by arrows. The directions of magnetic flux produced by the currents are indicated by cross marks and dot marks.

The coil conductors LC, LB, and LA illustrated in FIG. 11 preferably have configurations similar to the first coil conductors L1C2, L1B2, and L1A2 illustrated in FIG. 3 in the first preferred embodiment. The magnetic-field cancellation conductor pattern LD illustrated in FIG. 11 preferably has a configuration similar to that of the magnetic-field cancellation conductor pattern L1D illustrated in FIG. 3 in the first preferred embodiment.

As illustrated in FIG. 12, the magnetic-field cancellation conductor pattern LD in the inductance element 111 is connected in parallel to a portion of the coil conductor LA. The direction of magnetic flux produced by the coil conductors LA, LB, and LC and that produced by the magnetic-field cancellation conductor pattern LD are opposite to one another. That is, a high-frequency current flows in the magnetic-field cancellation conductor pattern LD in the direction opposite the direction in which a high-frequency current flows in the coil conductors LA, LB, and LC. Thus, the magnetic-field cancellation conductor pattern LD acts in a direction in which the magnetic flux produced by the coil conductors LA, LB, and LC is reduced and, therefore, decreases the inductance of the coil conductors LA, LB, and LC. Accordingly, the magnetic-field cancellation conductor pattern LD decreases the inductance of the primary coil L1. As in the case with the function on the primary coil in the high-frequency transformer structure illustrated in the first and second preferred embodiments, the inductance is able to be set at a predetermined value by the number of turns of the magnetic-field cancellation conductor pattern LD (length of the portion adjacent to the coil conductors of the magnetic-field cancellation conductor pattern LD) and the layer-to-layer distance between the magnetic-field cancellation conductor pattern LD and the coil conductor LA.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency transformer element comprising:
   a multilayer body including a plurality of insulating layers;
   a primary coil disposed in the multilayer body and including a first coil conductor arranged along a surface of the insulating layers and an interlayer connection conductor electrically connected to the first coil conductor; and
   a secondary coil disposed in the multilayer body and including a second coil conductor arranged along a surface of the insulating layers and an interlayer connection conductor electrically connected to the second coil conductor; wherein
   the secondary coil is electrically connected to the primary coil;
   a magnetic-field cancellation conductor pattern is disposed in the multilayer body;
   the magnetic-field cancellation conductor pattern is adjacent to a portion of the first coil conductor in a lamination direction of the insulating layers, is arranged along a surface of the insulating layers, and allows a high-frequency current to flow in a portion of the magnetic-field cancellation conductor pattern in a direction opposite a high-frequency current flowing in the portion of the first coil conductor; and
   the portion of the magnetic-field cancellation conductor pattern and the portion of the first coil conductor overlap with each other.

2. The high-frequency transformer element according to claim 1, wherein the magnetic-field cancellation conductor pattern is adjacent to the first coil conductor such that the magnetic-field cancellation conductor pattern and the second coil conductor are on opposite sides of the first coil conductor in the lamination direction.

3. The high-frequency transformer element according to claim 1, wherein the magnetic-field cancellation conductor pattern is connected in parallel to the first coil conductor.

4. The high-frequency transformer element according to claim 1, wherein the magnetic-field cancellation conductor pattern is disposed on an outer layer of the first coil conductor and the second coil conductor.

5. The high-frequency transformer element according to claim 1, wherein the magnetic-field cancellation conductor pattern has a same or substantially a same shape as a shape of a portion or all of the first coil conductor and the second coil conductor as seen in plan view.

6. The high-frequency transformer element according to claim 5, wherein the magnetic-field cancellation conductor pattern is located on a layer closer to the first coil conductor than the second coil conductor.

7. The high-frequency transformer element according to claim 5, wherein an amount of adjustment in inductance of the first coil conductor by the magnetic-field cancellation conductor pattern is defined by a length of a portion adjacent to the first coil conductor of the magnetic-field cancellation conductor pattern or by a distance from the magnetic-field cancellation conductor pattern to the first coil conductor in the lamination direction of the insulating layers.

8. An impedance conversion element comprising the high-frequency transformer element according to claim 1, wherein
   a first end of the primary coil is connected to a feeding port, a second end of the primary coil is connected to an antenna port, a first end of the secondary coil is connected to the antenna port, and a second end of the secondary coil is connected to a ground; and
   the impedance conversion element converts impedance between the feeding port and the antenna port.

9. The impedance conversion element according to claim 8, wherein
   the multilayer body has a rectangular or substantially rectangular parallelepiped shape;
   the impedance conversion element further includes input/output terminals on a first side and a second side of the multilayer body, respectively, the first side and the second side are opposed to each other as seen in plan view; and
   the impedance conversion element further includes a ground terminal on a third side or a fourth side of the multilayer body, and the third side and the fourth side are opposed to each other as seen in plan view.

10. An antenna device comprising:
    the impedance conversion element according to claim 8; and
    an antenna element connected to the antenna port.

11. A high-frequency transformer element comprising:
    a multilayer body including a plurality of insulating layers;
    a primary coil disposed in the multilayer body and including a first coil conductor arranged along a surface of the insulating layers and an interlayer connection conductor electrically connected to the first coil conductor; and
    a secondary coil disposed in the multilayer body and including a second coil conductor arranged along a surface of the insulating layers and an interlayer connection conductor electrically connected to the second coil conductor; wherein
    a magnetic-field cancellation conductor pattern is disposed in the multilayer body;
    the first coil conductor is disposed between the magnetic-field cancellation conductor pattern and the second coil conductor in a lamination direction;
    the magnetic-field cancellation conductor pattern is adjacent to a portion of the first coil conductor in the lamination direction of the insulating layers, is arranged along a surface of the insulating layers, and allows a high-frequency current to flow in a portion of the magnetic-field cancellation conductor pattern in a direction opposite a high-frequency current flowing in the portion of the first coil conductor; and
    the portion of the magnetic-field cancellation conductor pattern and the portion of the first coil conductor overlap with each other.

12. A high-frequency transformer element comprising:
    a multilayer body including a plurality of insulating layers;
    a primary coil disposed in the multilayer body and including a first coil conductor arranged along a surface of the insulating layers and an interlayer connection conductor electrically connected to the first coil conductor; and a secondary coil disposed in the multilayer body and including a second coil conductor arranged along a surface of the insulating layers and an interlayer connection conductor electrically connected to the second coil conductor; wherein a magnetic-field cancellation conductor pattern is disposed in the multilayer body;

the magnetic-field cancellation conductor pattern is connected in parallel to a portion of the first coil conductor;

the magnetic-field cancellation conductor pattern is adjacent to a portion of the first coil conductor in a lamination direction of the insulating layers, is arranged along a surface of the insulating layers, and allows a high-frequency current to flow in a portion of the magnetic-field cancellation conductor pattern in a direction opposite a high-frequency current flowing in the portion of the first coil conductor; and the portion of the magnetic-field cancellation conductor pattern and the portion of the first coil conductor overlap with each other.

* * * * *